US009570549B2

(12) United States Patent
Jang et al.

(10) Patent No.: US 9,570,549 B2
(45) Date of Patent: Feb. 14, 2017

(54) SEMICONDUCTOR NANOCRYSTAL AND PREPARATION METHOD THEREOF

(75) Inventors: Eun-Joo Jang, Suwon-si (KR);
Seok-Hwan Hong, Seoul (KR);
Shin-Ae Jun, Seongnam-si (KR);
Hyo-Sook Jang, Yongin-si (KR)

(73) Assignee: SAMSUNG ELECTRONICS CO., LTD., Gyeonggi Do (KR)

( * ) Notice: Subject to any disclaimer, the term of this patent is extended or adjusted under 35 U.S.C. 154(b) by 673 days.

(21) Appl. No.: 12/831,816

(22) Filed: Jul. 7, 2010

(65) Prior Publication Data

US 2011/0006281 A1 Jan. 13, 2011

(30) Foreign Application Priority Data

Jul. 8, 2009 (KR) .................. 10-2009-0062149
Jun. 11, 2010 (KR) .................. 10-2010-0055436

(51) Int. Cl.
| | | |
|---|---|---|
| C09K 11/62 | (2006.01) | |
| C09K 11/70 | (2006.01) | |
| H01L 29/06 | (2006.01) | |
| B82Y 30/00 | (2011.01) | |
| B82Y 40/00 | (2011.01) | |
| B82Y 10/00 | (2011.01) | |
| H01L 33/50 | (2010.01) | |
| H01L 51/50 | (2006.01) | |

(52) U.S. Cl.
CPC ........... *H01L 29/0665* (2013.01); *B82Y 10/00* (2013.01); *B82Y 30/00* (2013.01); *B82Y 40/00* (2013.01); *H01L 29/0673* (2013.01); *H01L 33/502* (2013.01); *H01L 51/502* (2013.01)

(58) Field of Classification Search
USPC ............... 252/301.4 R, 301.4 P, 301.6 R
See application file for complete search history.

(56) References Cited

U.S. PATENT DOCUMENTS

| | | |
|---|---|---|
| 6,251,303 B1 | 6/2001 | Bawendi et al. |
| 6,306,610 B1 | 10/2001 | Bawendi et al. |
| 6,319,426 B1 | 11/2001 | Bawendi et al. |
| 6,326,144 B1 | 12/2001 | Bawendi et al. |
| 6,444,143 B2 | 9/2002 | Bawendi et al. |
| 6,602,671 B1 | 8/2003 | Bawendi et al. |
| 6,617,583 B1 | 9/2003 | Bawendi et al. |
| 6,774,361 B2 | 8/2004 | Bawendi et al. |
| 6,855,551 B2 | 2/2005 | Bawendi et al. |

(Continued)

FOREIGN PATENT DOCUMENTS

| | | |
|---|---|---|
| JP | 2009-509129 A | 3/2009 |
| JP | 2009-132771 A | 6/2009 |

(Continued)

OTHER PUBLICATIONS

Yu. Forming Biocompatible and Nonaggregated Nanocrystals in Water Using Amphiphilic Polymers.J. Am. Chem. Soc. 2007, 129, 2871-2879.*

(Continued)

*Primary Examiner* — Matthew E Hoban
(74) *Attorney, Agent, or Firm* — Cantor Colburn LLP (57) ABSTRACT

A semiconductor nanocrystal and a preparation method thereof, where the semiconductor nanocrystal include a bare semiconductor nanocrystal and a water molecule directly bound to the bare semiconductor nanocrystal.

26 Claims, 4 Drawing Sheets

(56) References Cited

U.S. PATENT DOCUMENTS

| | | | |
|---|---|---|---|
| 7,235,361 B2 | 6/2007 | Bawendi et al. | |
| 7,358,525 B2 | 4/2008 | Lee | |
| 7,645,397 B2 * | 1/2010 | Parce et al. | 252/301.36 |
| 7,767,260 B2 * | 8/2010 | Peng et al. | 427/214 |
| 8,076,410 B2 * | 12/2011 | Nayfeh et al. | 524/789 |
| 8,221,651 B2 | 7/2012 | Murase et al. | |
| 2001/0023078 A1 | 9/2001 | Bawendi et al. | |
| 2001/0040232 A1 | 11/2001 | Bawendi et al. | |
| 2002/0160412 A1 | 10/2002 | Bawendi et al. | |
| 2004/0217298 A1 | 11/2004 | Bawendi et al. | |
| 2005/0118631 A1 | 6/2005 | Bawendi et al. | |
| 2008/0238299 A1 * | 10/2008 | Cho et al. | 313/503 |
| 2009/0315446 A1 | 12/2009 | Murase et al. | |
| 2010/0252778 A1 | 10/2010 | Murase et al. | |

FOREIGN PATENT DOCUMENTS

| | | |
|---|---|---|
| JP | 2010-138367 A | 6/2010 |
| KR | 1020070038088 A | 4/2007 |
| WO | 0017655 | 3/2000 |
| WO | 2004066361 A2 | 8/2004 |
| WO | 2009028282 A1 | 3/2009 |

OTHER PUBLICATIONS

Nelles. FUnctionalization of silicon nanoparticles via hydrosilylation with 1-alkenes. COlloid Polym Sci (2007) 258 729-736.*

Li. Surface Functionalization of Silicon Nanoparticles produced by Laser-driven pyrolysis of silane followed by HF—HNO3 etching. Langmuir 2004. 20, 4720-4727.*

Xie. InAs/InP/ZnSe Core/Shell/SHell quantum dots as near infrared emitters: Bright, Narrow band, non-cadmium containing, and biocompatible. Nano Res (2008) 1: 457-464.*

Micic. Highly efficient bandedge emission from InP quantum dots. Appl. Phys. Lett. 68 3150 (1996).*

Nazzal. Environmental Effects on Photoluminescence of Highly Luminescent CdSe and CdSe/ZnS Core/Shell Nanocrystals in Polymer Thin Films. J. Phys. Chem. B, 2004, 108 (18), pp. 5507-5515.*

Cordero. Photo-Activated Luminescence of CdSe Quantum Dot Monolayers. J. Phys. Chem. B 2000, 104, 12137-12142.*

Hodes, G., "Semiconductor and ceramic nanoparticle films deposited by chemical bath deposition", Physicial Chemistry Chemical Physics, 2007, vol. 9: 2181-2196.

Ryu, E. et al., "Step-wise synthesis of InP/ZnS core-shell quantum dots and the role of zinc acetate", Chemistry of Materials, 2009, vol. 21 (4): 573-575.

International Search Report for Application No. PCT/KR2010/004413 dated Feb. 25, 2011.

Japanese Office Action for Japanese Patent Application No. 2012-519473 dated Mar. 11, 2014 with English Translation.

Chinese Office Action for Chinese Patent Application No. 201080039453.5 dated Sep. 22, 2013 with English Translation.

Jaehoon Lim et al. "InP@ZnSeS, Core@Composition Gradient Shell Quantum Dots with Enhanced Stability", Chem. Mater. 2011, 23, 4459-4463.

* cited by examiner

SEMICONDUCTOR NANOCRYSTAL AND PREPARATION METHOD THEREOF

CROSS-REFERENCE TO RELATED APPLICATION

This application claims priority to and the benefit under 35 U.S.C. §119 of Korean Patent Application No. 10-2009-0062149 filed in the Korean Intellectual Property Office on Jul. 8, 2009 and Korean Patent Application No. 10-2010-0055436 filed in the Korean Intellectual Property Office on Jun. 11, 2010, the entire contents of both applications being incorporated herein by reference.

BACKGROUND

1. Field

This disclosure relates to a semiconductor nanocrystal and a method of preparing the same.

2. Description of the Related Art

Semiconductor nanocrystals, which are also called quantum dots, are semiconductor materials having a nano-sized crystalline structure and including hundreds to thousands of atoms. Since the semiconductor nanocrystals are very small, the surface area per unit volume is very high, leading to an effect of quantum confinement. Semiconductor nanocrystals, therefore, develop unique physiochemical characteristics that are different from the usual inherent characteristics of semiconductor materials.

In particular, certain of the characteristics of semiconductor nanocrystals such as photoelectrons may be controlled by adjusting the size of the nanocrystal, such that utilization of the semiconductor nanocrystals in a display device or bioluminescent light-emitting device is being investigated. Moreover, since the semiconductor nanocrystals do not contain heavy metals, these materials are environment-friendly and safe for the human body.

SUMMARY

In an embodiment this disclosure provides a semiconductor nanocrystal having high luminous efficiency.

Another embodiment provides a method of preparing the semiconductor nanocrystal.

Yet another embodiment of this disclosure provides a semiconductor nanocrystal composite.

Still another embodiment of this disclosure provides a light emitting device including the semiconductor nanocrystal.

According to one embodiment of this disclosure, a semiconductor nanocrystal is provided that includes a bare semiconductor nanocrystal and a water molecule directly bound to the bare semiconductor nanocrystal.

The bare semiconductor nanocrystal may be bound to the water molecule via a coordination bond, an ionic bond, a hydrogen bond, a van der Waals force, or a combination thereof.

The semiconductor nanocrystal may further include an organic ligand bound to the bare semiconductor nanocrystal and represented by the following Chemical Formula 1.

$$X-(R)n-Ym \qquad \text{Chemical Formula 1}$$

In Chemical Formula 1, R is selected from a C1 to C30 alkylene group; a C6 to C30 arylene group; a C6 to C30 heteroarylene group; a C3 to C30 cycloalkylene group; a C3 to C30 heterocycloalkylene group; a C2 to C30 alkenylene group; a C2 to C30 alkynylene group; a C3 to C30 alicyclic group including a double bond or a triple bond in a ring; a C3 to C30 heterocycloalkylene group including a double bond or a triple bond in a ring; a C3 to C30 alicyclic group substituted with a C2 to C30 alkenyl group or C2 to C30 alkynyl group; or a C3 to C30 heterocycloalkylene group substituted with a C2 to C30 alkenyl group or a C2 to C30 alkynyl group, n is an integer of 0, 1, or more than 1, X is selected from S, SH, P, P=O, $PO_3$, NH, $H_2N$, CN, NCO, O, a halogen, an acyl halide, COO, COOH, H, OH, or a combination thereof, Y is selected from SH, NH, $H_2N$, COO, H, OH, or $PO_3H$, and m is an integer ranging of 1 or more.

In Chemical Formula 1, n may be an integer of 0 to 5, and m may be an integer of 1 to 10. Also, in Chemical Formula 1, Y may be selected from SH, NH, $H_2N$, or a combination thereof.

In certain embodiments the bare semiconductor nanocrystal may have a core structure or core-shell structure.

The core may include a Group II-VI semiconductor material, a Group III-V semiconductor material, a Group IV semiconductor material, or a Group IV-VI semiconductor material. The shell may include a Group II-VI semiconductor material, a Group III-V semiconductor material, a Group IV semiconductor material, or a Group IV-VI semiconductor material.

In certain embodiments one or more functional groups of —OH, —O, or —H may be bound with the bare semiconductor nanocrystal. The functional group may be bound with a metal atom included in the bare semiconductor nanocrystal.

The semiconductor nanocrystal according to an embodiment may include a Group III-V semiconductor in a core. The semiconductor nanocrystal according to an embodiment may have luminous efficiency of about 50% or more, and in an embodiment, may have luminous efficiency of about 70% or more.

The semiconductor nanocrystal may have a full width at half maximum ("FWHM") of about 60 nm or less, and in an embodiment, may have the FWHM of about 55 nm or less, about 50 nm or less, or about 45 nm or less.

A method of preparing a semiconductor nanocrystal according to an embodiment of this disclosure may include mixing a first semiconductor nanocrystal and water. The weight ratio of water to the first semiconductor nanocrystal may range from about 1:1 to about 100:1. In an embodiment, the weight ratio of water to the first semiconductor nanocrystal may range from about 1:1 to about 10:1.

The mixing of the first semiconductor nanocrystal and the water may include preparing a semiconductor nanocrystal solution including an organic solvent and a first semiconductor nanocrystal, and then adding the water to the semiconductor nanocrystal solution. The water may be added in an amount of about 0.01 parts by volume to about 100 parts by volume based on about 100 parts by volume of the semiconductor nanocrystal solution.

The mixing of the first semiconductor nanocrystal and water may be performed under an inert gas atmosphere.

The nanocrystal preparation method may further include irradiating light to the semiconductor nanocrystal solution. The light may have energy higher than an energy band gap of the semiconductor nanocrystal. The light may have a shorter wavelength than the light emission wavelength of the semiconductor nanocrystal.

The nanocrystal preparation method may further include mixing the first semiconductor nanocrystal and a polar compound. The polar compound may be included in a volume ratio of about 0.1:1 to about 10:1 with respect to the amount of the water.

The first semiconductor nanocrystal may have a core structure or a core-shell structure.

The first semiconductor nanocrystal may further be bound to an organic ligand represented by the above Chemical Formula 1 on the first semiconductor nanocrystal.

A semiconductor nanocrystal composite according to another embodiment may include a matrix and the semiconductor nanocrystal. The matrix may include poly(vinyl alcohol), poly(vinyl carbazole), poly(vinyl fluoride), poly(methyl vinyl ether), polyethylene, poly(propylene), poly(styrene), poly(vinyl pyridine), poly(ethylene oxide), poly(alkylacrylate), for example a poly(C1-C6alkylacrylate), poly(silane), (polycarbonate), poly(siloxane), poly(acrylate), epoxy polymer, titania, silica, alumina, zirconia, indium tin oxide, or a mixture thereof.

According to another embodiment of this disclosure, a light emitting device includes the semiconductor nanocrystal. The light emitting device may include a first and a second electrode, and the semiconductor nanocrystal or semiconductor nanocrystal composite disposed between the electrodes. The light emitting device may include a light source, and the semiconductor nanocrystal or the semiconductor nanocrystal composite may be disposed on the light source.

DETAILED DESCRIPTION

This disclosure will be described more fully in the following detailed description of the invention, and with reference to the accompanying drawings, in which some but not all embodiments of this disclosure are shown. This disclosure may, however, be embodied in many different forms and should not be construed as limited to the exemplary embodiments set forth herein; rather, these embodiments are provided so that this disclosure will be thorough and complete, and will fully convey the teachings of the invention to those skilled in the art. Like reference numerals and variables refer to like elements throughout.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, the term "and/or" includes any and all combinations of one or more of the associated listed items.

It will be understood that, although the terms first, second, third, etc., can be used herein to describe various elements, components, regions, layers and/or sections, these elements, components, regions, layers and/or sections should not be limited by these terms. These terms are only used to distinguish one element, component, region, layer, or section from another region, layer or section. Thus, a first element, component, region, layer, or section discussed below could be termed a second element, component, region, layer, or section without departing from the teachings of the exemplary embodiments of the invention.

Spatially relative terms, such as "below," "lower," "upper" and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "lower" relative to other elements or features would then be oriented "above" relative to the other elements or features. Thus, the exemplary term "below" can encompass both an orientation of above and below. The device can be otherwise oriented (rotated 90 degrees or at other orientations) and the spatially relative descriptors used herein interpreted accordingly.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

The terminology used herein is for the purpose of describing particular embodiments only and is not intended to be limiting. As used herein, the singular forms "a," "an" and "the" are intended to include the plural forms as well, unless the context clearly indicates otherwise. The terms "comprises" and/or "comprising," or "includes" and/or "including" when used in this specification, specify the presence of stated features, regions, integers, steps, operations, elements and/or components, but do not preclude the presence or addition of one or more other features, regions, integers, steps, operations, elements, components and/or groups thereof.

Unless otherwise defined, all terms (including technical and scientific terms) used herein have the same meaning as commonly understood by one of ordinary skill in the art to which this invention belongs. All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed.

"Alkylene" as used herein means a divalent straight or branched chain saturated aliphatic hydrocarbon. Alkylene groups include, for example, groups having from 1 to 15 carbon atoms (C1-C15 alkyl). "Alkenylene" means a divalent straight or branched chain hydrocarbon that includes at least one carbon-carbon double bond; and "alkynylene" refers to a divalent straight or branched chain hydrocarbon that has one or more unsaturated carbon-carbon bonds, at least one of which is a triple bond.

"Cycloalkylene" as used herein means a divalent group that includes one or more saturated rings in which all ring members are carbon, such as cyclopropylene, cyclobutylene, cyclopentylene, cyclohexylene, cycloheptylene, cyclooctylene, and adamantylene. Cycloalkylene groups do not include an aromatic ring or a heterocyclic ring. When numbers of carbon atoms are recited (e.g., C1 to C10 cycloalkyl), these numbers indicate the number of ring members.

As used herein, an "amine group" is a group of the formula $-N(R_w)(R_z)$, wherein $R_w$ and $R_z$ is each independently a hydrogen, a C1 to C15 alkyl, a C1 to C15 alkenyl, a C1 to C15 alkynyl, a C3 to C15 cycloalkyl or a C6 to C15 aryl.

"Arylene" as used herein is a divalent cyclic moiety in which all ring members are carbon and at least one ring is aromatic. More than one ring may be present, and any additional rings may be independently aromatic, saturated or partially unsaturated, and may be fused, pendant, spirocyclic or a combination thereof.

Figure 1:
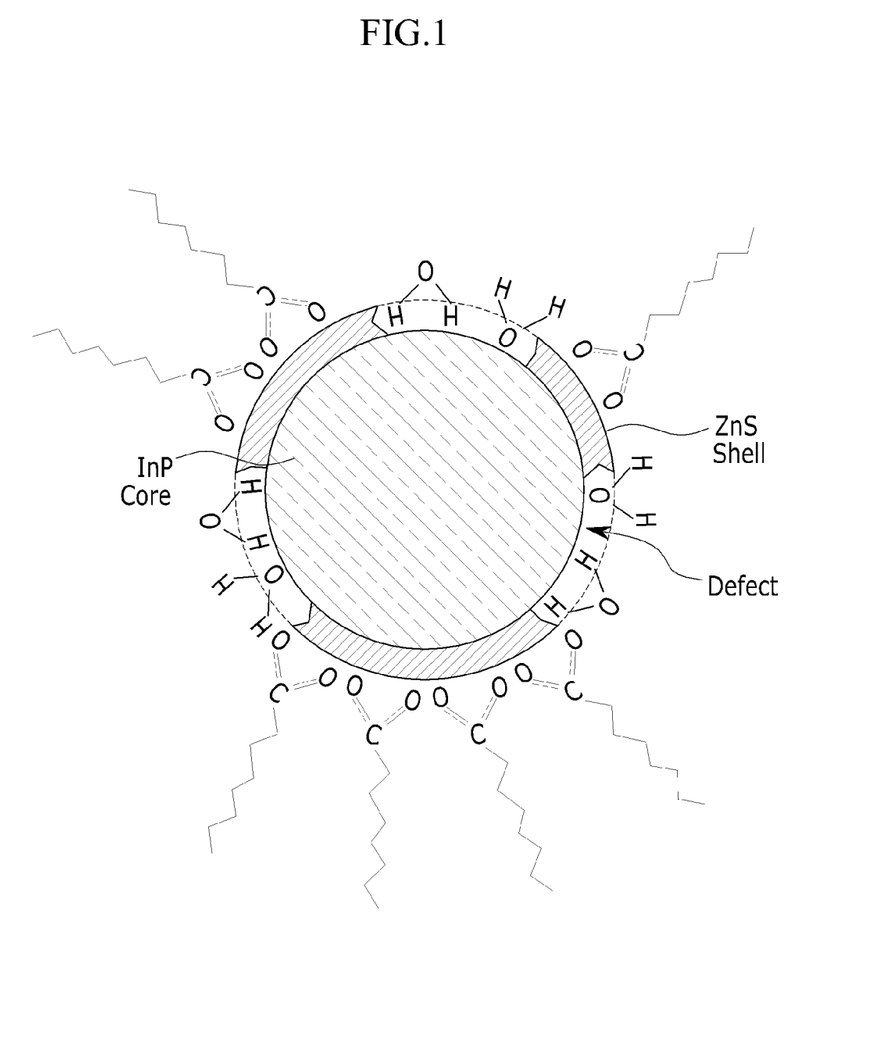
FIG. 1 is a schematic cross-sectional view of a semiconductor nanocrystal according to an embodiment of this disclosure.

Through the present disclosure, reference is made to various heterocyclic groups. Within such groups, the term "hetero" refers to a group that includes at least one ring member that is a heteroatom (e.g., 1, 2 or 3 heteroatoms that are independently N, O, S, P, or Si). "Heterocycloalkylene" groups include at least one cycloalkylene ring that contains a heteroatom ring member. "Heteroarylene" groups include at least one aromatic ring that contains a heteroatom ring member. Non-aromatic and/or carbocyclic rings may also be present in a heteroarylene group, provided that at least one ring is both aromatic and contains a ring member that is a heteroatom. FIG. 1 is a schematic view of a semiconductor nanocrystal according to an embodiment of this disclosure.

The semiconductor nanocrystal according to an embodiment of this disclosure may include a bare semiconductor nanocrystal and a water molecule directly linked to the bare semiconductor nanocrystal. Herein, the bare semiconductor nanocrystal is a semiconductor material crystal having a diameter of about 1 to about 20 nm.

The water molecule may be bound to the surface or interior of the semiconductor nanocrystal via a coordination bond, an ionic bond, a hydrogen bond or by a van der Waals force. For example, the bare semiconductor nanocrystal may have a defect and the bare semiconductor nanocrystal may be bound to the water molecule via a coordination bond in the defect. The water molecule may passivate the semiconductor nanocrystal and thereby protect the semiconductor nanocrystal, which may improve the quantum efficiency of the semiconductor nanocrystal.

A functional group derived from the water molecule may be bound to the semiconductor nanocrystal. For example, one or more functional groups of $-OH$, $-O$, or $-H$ may be bound to the bare semiconductor nanocrystal. For example, when the semiconductor nanocrystal includes Zn as a metal atom, at least some of a plurality of Zn elements that are not bound with an organic material or any other metal atoms may form a Zn—O or a Zn—H bond by bonding with $-OH$, $-O$, or $-H$.

The bare semiconductor nanocrystal may have a core structure or a core-shell structure. Herein, the term "core structure" means a structure only formed of a core without a shell, whereas a "core-shell" structure means a structure including a core and one or more shells surrounding the core. The core may be an alloy, and at least one of the shells may be an alloy layer.

The bare semiconductor nanocrystal core may include a Group II-VI semiconductor, a Group III-V semiconductor, a Group IV semiconductor, or a Group IV-VI semiconductor. The core illustrated in FIG. 1 includes InP.

A Group II element may be selected from Zn, Cd, Hg, and a combination thereof, and a III group element may be selected from Al, Ga, In, Tl, and a combination thereof. A Group IV element may be selected from Si, Ge, Sn, Pb, and a combination thereof and a Group V element may be selected from P, As, Sb, Bi, and a combination thereof. A Group VI element may be selected from O, S, Se, Te, and a combination thereof.

The bare semiconductor nanocrystal shell may include a Group II-VI semiconductor, a Group III-V semiconductor, a Group IV semiconductor, or a Group IV-VI semiconductor. The shell illustrated in FIG. 1 includes ZnS. In a shell defect, the surface or interior of the semiconductor nanocrystal core may be bound to water molecules. Alternatively the surface or the interior of the shell may be bound with water molecules.

When the bare semiconductor nanocrystal has a core-shell structure, the bare semiconductor nanocrystal shell and water molecules may densely surround the bare semiconductor nanocrystal core, and thus, the quantum efficiency of the semiconductor nanocrystal may be enhanced.

The semiconductor nanocrystal may further include an organic ligand bound to the surface or the interior of the bare semiconductor nanocrystal. The organic ligand is capable of being physically or chemically bound to the bare semiconductor nanocrystal. The organic ligand may be a material including a pair of non-shared electrons, or a material having a functional group for forming a complex compound with a metallic material. For example, the functional group may be selected from a thiol group, an amine group, a carboxyl group, a phosphine group, a phosphine oxide group, and a combination thereof. The organic ligand may be a substituted or unsubstituted hydrocarbon compound having a weight average molecular weight of about 10 to about 100,000 Daltons, or about 100 to about 1,000 Daltons. For example, the hydrocarbon compound may include an alkane, an alkene, an alkyne, an aromatic hydrocarbon, a heterocyclic compound including N, O, S, or a combination thereof. The organic ligand may be represented by the following Chemical Formula 1.

$$X\text{—}(R)n\text{-}Ym \qquad \text{Chemical Formula 1}$$

In Chemical Formula 1, R is selected from a C1 to C30 alkylene group; a C6 to C30 arylene group; a C6 to C30 heteroarylene group; a C3 to C30 cycloalkylene group; a C3 to C30 heterocycloalkylene group; a C2 to C30 alkenylene group; a C2 to C30 alkynylene group; a C3 to C30 alicyclic group including a double bond or a triple bond in a ring; a C3 to C30 heterocycloalkylene group including a double bond or a triple bond in a ring; a C3 to C30 alicyclic group substituted with a C2 to C30 alkenyl group or C2 to C30 alkynyl group; or a C3 to C30 heterocycloalkylene group substituted with a C2 to C30 alkenyl group or a C2 to C30 alkynyl group, n is an integer of 0, 1, or more, X is selected from S, SH, P, P=O, $PO_3$, NH, $H_2N$, CN, NCO, O, a halogen, an acyl halide, COO, COOH, H, OH, or a combination thereof, Y is selected from SH, NH, $H_2N$, COO, H, OH, or $PO_3H$, and m is an integer of 1 or more.

In Chemical Formula 1, n may be an integer of 0 to 5, m may be an integer of 1 to 10. Also, in Chemical Formula 1, Y may be selected from SH, NH, $H_2N$, or a combination thereof.

X may be a functional group that is physically or chemically bound to the bare semiconductor nanocrystal.

Non-limiting examples of the organic ligand may include, but are not limited to, thiols such as methane thiol, ethane thiol, propane thiol, butane thiol, pentane thiol, hexane thiol, octane thiol, dodecane thiol, hexadecane thiol, octadecane thiol, benzyl thiol, and the like; mercapto spacer alcohols such as mercapto methanol, mercapto ethanol, mercapto propanol, mercapto butanol, mercapto pentenol, mercapto hexanol, and the like; mercapto spacer carbonic acids such as mercapto acetic acid, mercapto propionic acid, mercapto butanoic acid, mercapto hexanoic acid, mercapto heptane, and the like; mercapto spacer sulfonic acids such as mercapto methane sulfonic acid, mercapto ethane sulfonic acid, mercapto propane sulfonic acid, mercapto benzene sulfonic acid, and the like; mercapto spacer amines such as mercapto methane amine, mercapto ethane amine, mercapto propane amine, mercapto butane amine, mercapto pentane amine, mercapto hexane amine, mercapto pyridine, and the like; mercapto spacer thiols such as mercapto methyl thiol, mercapto ethyl thiol, mercapto propyl thiol, mercapto butyl thiol, mercapto pentyl thiol, and the like; amines such as methane amine, ethane amine, propane amine, butane amine, pentane amine, hexane amine, octane amine, dodecane amine, hexadecyl amine, octadecyl amine, dimethyl amine, diethyl amine, dipropyl amine, and the like; amino spacer alcohols such as amino methanol, amino ethanol, amino propanol, amino butanol, amino pentanol, amino hexanol, and the like; amino spacer carbonic acids such as amino acetic acid, amino propionic acid, amino butanoic acid, amino hexanoic acid, amino heptane, and the like; amino spacer sulfonic acids such as amino methane sulfonic acid, amino ethane sulfonic acid, amino propane sulfonic acid, amino benzene sulfonic acid, and the like; amino spacer amine or diamines such as amino methane amine, amino ethane amine, amino propane amine, amino butyl amine, amino pentyl amine, amino hexyl amine, amino benzene amine, amino pyridine, and the like; carboxylic acids such as methanoic acid (formic acid), ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, and the like; carboxylic acid spacer alcohols such as carboxylic acid methanol (i.e., a carboxylic acid group separated from an alcohol group by a —CH$_2$— group, or 2-hydroxyethanoic acid), carboxylic acid ethanol (i.e., 3-hydroxy propanoic acid), carboxylic acid propanol, carboxylic acid butanol, carboxylic acid pentanol, carboxylic acid hexanol, and the like; carboxylic acid spacer sulfonic acids such as carboxylic acid methane sulfonic acid, carboxylic acid ethane sulfonic acid, carboxylic acid propane sulfonic acid, carboxylic acid benzene sulfonic acid, and the like, carboxylic acid spacer carboxylic acids such as carboxylic acid methane carboxylic acid (i.e., propanedioic acid), carboxylic acid ethane carboxylic acid (i.e., butanedioic acid), carboxylic acid propane carboxylic acid, carboxylic acid propane carboxylic acid, carboxylic acid benzene carboxylic acid, and the like; phosphines such as methyl phosphine, ethyl phosphine, propyl phosphine, butyl phosphine, pentyl phosphine, and the like; phosphine spacer alcohols such as phosphine methanol, phosphine ethanol, phosphine propanol, phosphine butanol, phosphine pentenol, phosphine hexanol, and the like; phosphine spacer sulfonic acids such as phosphine methane sulfonic acid, phosphine ethane sulfonic acid, phosphine propane sulfonic acid, phosphine benzene sulfonic acid, and the like; phosphine spacer carboxylic acids such as phosphine methane carboxylic acid, phosphine ethane carboxylic acid, phosphine propane carboxylic acid, phosphine benzene carboxylic acid, and the like; phosphine spacer amines such as phosphine methane amine, phosphine ethane amine, phosphine propane amine, phosphine benzene amine, and the like; phosphine oxides such as methyl phosphine oxide, ethyl phosphine oxide, propyl phosphine oxide, butyl phosphine oxide, and the like; phosphine oxide alcohols such as phosphine oxide methanol, phosphine oxide ethanol, phosphine oxide propanol, phosphine oxide butanol, phosphine oxide pentenol, phosphine oxide hexanol, and the like; phosphine oxide spacer sulfonic acids such as phosphine oxide methane sulfonic acid, phosphine oxide ethane sulfonic acid, phosphine oxide propane sulfonic acid, phosphine oxide benzene sulfonic acid, and the like; phosphine oxide spacer carboxylic acids such as phosphine oxide methane carboxylic acid, phosphine oxide ethane carboxylic acid, phosphine oxide propane carboxylic acid, phosphine oxide benzene carboxylic acid, and the like; and phosphine oxide spacer amines such as phosphine oxide methane amine, phosphine oxide ethane amine, phosphine oxide propane amine, phosphine oxide benzene amine, and the like. Non-limiting examples of the spacer may include C1 to C16 alkylene, and C6 to C24 arylene.

In an embodiment of this disclosure, the semiconductor nanocrystal may include a Group III-V semiconductor as a core, it may have a luminous efficiency of about 50% or more. In an embodiment, it may have a luminous efficiency of about 60% or more, or about 70% or more, and in another embodiment, may have a luminous efficiency of about 80% or more. The semiconductor nanocrystal may have a full width at half maximum (FWHM) of about 60 nm or less, about 55 nm or less, or about 50 nm or less. In an embodiment, it may have the FWHM of about 45 nm or less, and in another embodiment, it may have the FWHM of about 40 nm or less. When the FWHM is smaller, color purity is increased. For example, the semiconductor nanocrystal including a Group III-V semiconductor may have a light emitting peak at a wavelength range of about 510 to 560 nm, a luminous efficiency of about 70% or more, and the FWHM of about 45 nm or less. In an embodiment, the light emitting peak wavelength may be in range of about 560 to 580 nm, the luminous efficiency may be about 70% or more, and the FWHM may be about 50 nm or less. In another embodiment, the light emitting peak wavelength may be about 580 to 640 nm, the luminous efficiency may be about 70% or more, and the FWHM may be about 60 nm or less.

Hereafter, a method for preparing a semiconductor nanocrystal in accordance with an embodiment of this disclosure will be described. Duplication of the above description of the semiconductor nanocrystal in the above will be omitted hereinafter.

A method of preparing the nanocrystal may include mixing a first semiconductor nanocrystal and water. In the mixing process, the water may be bound by hydration of the first semiconductor nanocrystal.

The first semiconductor nanocrystal is a semiconductor nanocrystal without a bond with water, and may be prepared by a common wet (solvent) process under an organic solvent. The first semiconductor nanocrystal may have a core structure or a core-shell structure. Herein, the core or shell may be independently formed with a Group II-VI semiconductor material, a Group III-V semiconductor material, a Group IV semiconductor material, or a Group IV-VI semiconductor material. Further, the first semiconductor nanocrystal may be the bare semiconductor nanocrystal described above, or a bare semiconductor nanocrystal bound with an organic ligand on the surface or interior of the bare semiconductor nanocrystal. The organic ligand may be represented by the above Chemical Formula 1.

The water may be used in a weight ratio of about 1 to about 100 with respect to the first semiconductor nanocrystal, that is, about 1 to about 100 parts by weight of water per 1 part by weight of the first semiconductor nanocrystal. The water may be used in a small amount based on an amount of the first semiconductor nanocrystal, and for example, may be used in a weight ratio of about 1 to about 10 with respect to the first semiconductor nanocrystal.

The water may be present as a liquid or a vapor.

The mixing process of the first semiconductor nanocrystal and the water may include preparing a semiconductor nanocrystal solution including an organic solvent and a first semiconductor nanocrystal, and then adding the water to the semiconductor nanocrystal solution.

The organic solvent may include one or more aromatic solvents such as chlorobenzene; an alkane solvent such as hexane or octane; a nonpolar solvent such as methyl chloride; a polar solvent such as dimethyl formamide or tetrahydrofuran; and the like.

The water may be added in an amount of about 0.01 parts by volume to about 100 parts by volume, about 0.1 parts by volume to about 30 parts by volume, or about 1 part by volume to about 10 parts by volume based on 100 parts by volume of the semiconductor nanocrystal solution. When the first semiconductor nanocrystal is included at about 1 wt % based on the solvent, the semiconductor nanocrystal solution may have optical density of about 0.01 to about 2. The optical density refers to absorbance at a first absorption maximum wavelength with respect to an excitation source having a wavelength of about 300 nm to about 1200 nm.

Alternatively, the mixing process of the first semiconductor nanocrystal and the water may include a process of spraying water onto a dispersion body such as a powder or a layer including the first semiconductor nanocrystal.

The mixing process of the first semiconductor nanocrystal and the water may be performed at about 10° C. to about 150° C. When the reaction temperature increases, an increasing rate of luminous efficiency for the semiconductor nanocrystal may be achieved.

The mixing process of the first semiconductor nanocrystal and the water may be performed under an inert gas atmosphere. Therefore, the first semiconductor nanocrystal may maintain its physical and chemical characteristics by preventing rapid oxidation of the first semiconductor nanocrystal. Examples of the inert gas may include nitrogen, argon, or the like.

A polar compound may further be added to the first semiconductor nanocrystal with the water. The polar compound may help bond formation between the first semiconductor nanocrystal and water molecules, and may increase solubility of the water molecules in a semiconductor nanocrystal solution.

Examples of the polar compound may include a polar solvent. Non-limiting examples of the polar solvent include an amide-based polar solvent such as dimethyl formamide; an ether-based polar solvent such as tetrahydrofuran; an alcohol such as ethanol, propanol, pentenol, hexanol, and the like; and a mixture thereof.

The polar compound may be used in a small amount. The water and polar compound may be used at a volume ratio from about 1:about 0.1, to about 1:about 10. In an embodiment, the water and polar compound may be used at a volume ratio of about 1:about 0.5, to about 1:about 5. The polar compound may be added in an amount of about 0.1 part by volume to about 100 parts by volume based on about 100 parts by volume of the semiconductor nanocrystal solution. In an embodiment, the polar compound solution may be added in an amount of about 0.5 parts by volume to about 50 parts by volume based on about 100 parts by volume of the semiconductor nanocrystal solution.

After adding water to the first semiconductor nanocrystal, the resultant mixture may be irradiated with light of a wavelength as described in further detail below. For example, the light irradiation may be conducted for about 1 minute to about 500 hours, depending on the light emitting wavelength of the semiconductor nanocrystal. When reversible desorption or coordination of an organic material coordinated on the surface or the interior of the first semiconductor is accelerated through the light irradiation, water molecules may be bound with the first semiconductor nanocrystal in a defect via a coordination bond, or a part of the surface or the interior of a first semiconductor nanocrystal may be oxidized, and therefore, a part of the first semiconductor nanocrystal structure may be changed and luminous efficiency may be improved. Further, water molecules may be decomposed by irradiation or by electrons or holes located on the surface or the interior of the first semiconductor nanocrystal. Alternatively or in addition, a photo-polymerization polymer reaction of an organic solvent or an organic ligand may be promoted. For example, a polymer derived from an acrylate, an olefin, or the like may be produced through a photo-polymerization of water, an organic solvent or an organic ligand, and such a polymer may surround the semiconductor nanocrystal. Through the passivation of the semiconductor nanocrystal, the semiconductor nanocrystal may have increased luminous efficiency, and life-span.

The irradiating light may have an energy corresponding to more than an energy band gap of the semiconductor nanocrystal. The irradiating light may have a shorter wavelength than the light emitting wavelength of the first semiconductor nanocrystal, and light of an ultraviolet (UV) ray region may be used. For example, for a red semiconductor nanocrystal emitting light with a wavelength that is longer than about 600 nm, the irradiating light may have a wavelength of about 300 nm to about 590 nm. For a yellow semiconductor nanocrystal emitting light with a wavelength ranging from about 570 nm to about 590 nm, the irradiating light may have a wavelength of about 300 nm to about 560 nm. For a green semiconductor nanocrystal emitting light with a wavelength ranging from about 520 nm to about 565 nm, the irradiating light may have a wavelength of about 300 nm to about 510 nm.

The time of the light irradiation may be adjusted according to the wavelength of the light emitted from the semiconductor nanocrystal, and for example, the semiconductor nanocrystal may be irradiated with the light for about 1 minute to 500 hours.

An embodiment of this disclosure provides a composition including a semiconductor nanocrystal, an organic solvent, and water, where the water is included in an amount of about 0.01 part by volume or more to about 100 parts by volume based on 100 parts by volume of the organic solvent.

The water may be included in an amount of about 0.1 parts by volume to about 30 parts by volume based on 100 parts by volume of the organic solvent, and in an embodiment, may be added in an amount of about 1 part by volume to about 10 parts by volume. In the composition, the water may be added in an amount of about 1 to about 100 parts by weight with respect to the semiconductor nanocrystal. Further, the semiconductor nanocrystal of the composition may be a bare semiconductor nanocrystal bound with an organic ligand on the surface or interior of the bare semiconductor nanocrystal. Also, the semiconductor nanocrystal may be a bare semiconductor nanocrystal bound with a water molecule.

A semiconductor nanocrystal composite will be next described.

A semiconductor nanocrystal composite includes a matrix and a semiconductor nanocrystal prepared according to exemplary embodiments of this disclosure. The semiconductor nanocrystal composite may be a semiconductor nanocrystal dispersed in a matrix, or a cluster-type semiconductor nanocrystal dispersed in a matrix. At least some of the semiconductor nanocrystals may be disposed on a surface of the matrix. The semiconductor nanocrystal may be introduced in a matrix after undergoing passivation by a polymer.

The matrix may be an organic material, an inorganic material, or a mixture thereof. In order to utilize light emitting characteristics of the semiconductor nanocrystal, a matrix having transparency may be used. It is further advantageous if a matrix that blocks transmission of oxygen and/or water is used. For processing into a film or a sheet, a matrix having workability (ready processability into a film or sheet) may be used. Examples of the matrix may include: a polymer such as poly(vinyl alcohol), poly(vinyl carbazole), poly(vinyl fluoride), poly(methyl vinyl ether), poly (ethylene), polypropylene, polystyrene, poly(vinyl pyridine), poly(ethylene oxide), poly(alkylacrylate), for example a poly(C1-C6alkylacrylate), poly(silane), poly(carbonate), poly(siloxane), poly(acrylate), epoxy, or the like; an inorganic material such as titania, silica, alumina, zirconia, indium tin oxide, or the like; or a mixture thereof.

Figure 2:
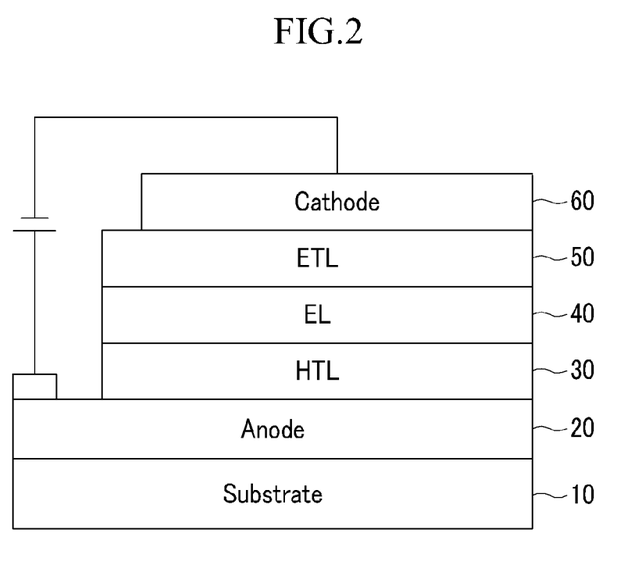
FIG. 2 is a cross-sectional view of a current driving type of light emitting device including a semiconductor nanocrystal according to an embodiment of this disclosure.

Hereinafter, a light emitting device according to an embodiment of this disclosure will be described. Referring to FIG. 2, a current-driven light emitting device including the semiconductor nanocrystal as an emitting material will be described hereafter.

FIG. 2 is a cross-sectional view of an light emitting device including a semiconductor nanocrystal according to an embodiment of this disclosure.

A current-driven light emitting device is fabricated by forming an emission layer between a first and a second electrode, and injecting electrons and holes from the first and second electrodes into the light emission layer to thereby produce excitons based on the bonding between the electrons and holes. Light is generated when the excitons fall to a ground state from an exited state.

For example, as illustrated in FIG. 2, a current-driven light emitting device is disposed in an anode 20 over a substrate 10. The anode 20 may be formed of a material having a high work function such that the holes may be injected. Non-limiting examples of the material for forming the anode 20 include indium tin oxide (ITO), and a transparent oxide of indium oxide.

Over the anode 20, a hole transport layer (HTL) 30, an emission layer (EL) 40, and an electron transport layer (ETL) 50 are sequentially formed. The hole transport layer 30 may include a p-type semiconductor, and the electron transport layer 50 may include an n-type semiconductor or a metal oxide. The emission layer 40 includes a nanocrystal prepared according to an embodiment of this disclosure.

A cathode 60 is formed over the electron transport layer 50. The cathode 60 may be formed of a material having a low work function such that electrons may be easily injected into the electron transport layer 50. Non-limiting examples of the material for forming the cathode 60 include a metal selected from the group consisting of magnesium, calcium, sodium, potassium, titanium, indium, yttrium, lithium, gadolinium, aluminum, silver, tin, lead, cesium, barium and an alloy thereof; and a multi-layer structure material such as LiF/Al, $LiO_2$/Al, LiF/Ca, LiF/Al and $BaF_2$/Ca, but this disclosure is not limited thereto.

The emission layer may include the semiconductor nanocrystal or the semiconductor nanocrystal composite prepared according to the embodiments of this disclosure.

Since a method for fabricating the anode 20, the hole transport layer 30, the emission layer 40, the electron transport layer 50 and the cathode 60 and a method for assembling them are widely known to those skilled in the art, these methods will not be described in detail in this specification.

Figure 3:
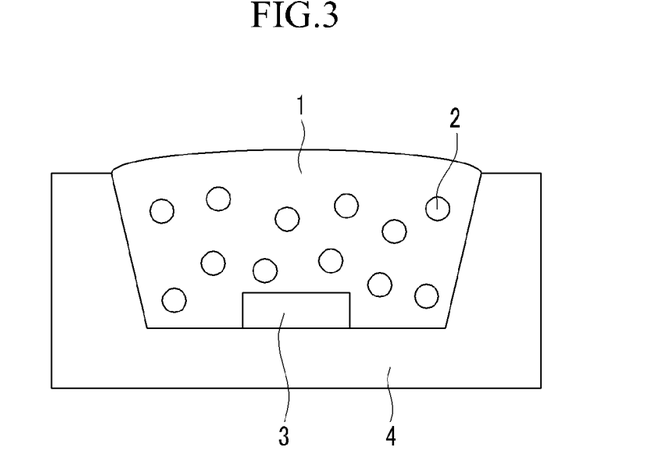
FIG. 3 is a cross-sectional view of a light-transforming emitting device according to an embodiment of this disclosure.

Referring to FIG. 3, a light-transforming light emitting device including the semiconductor nanocrystal as a light emitting material will be described as an example of the light emitting device.

The light-transforming light emitting device may include a light source and a light transforming emission layer disposed on the light source. The emission layer may include the semiconductor nanocrystal of the exemplary embodiments of this disclosure or the semiconductor nanocrystal composite, and the light source may be a light emitting diode chip.

FIG. 3 is a cross-sectional view of a light-transforming emitting device according to an embodiment of this disclosure.

A substrate 4 formed of Ag is prepared. The substrate 4 includes a recess portion. A light emitting diode chip 3 emitting light corresponding to blue or ultraviolet (UV) region is formed on the substrate 4.

A matrix 1 including a semiconductor nanocrystal 2 is formed on the light emitting diode chip 3. The semiconductor nanocrystal 3 may be a red, green or blue nanocrystal. Also, the matrix 1 may be an organic material or an inorganic material as described above. The semiconductor nanocrystal 2 may be inserted into the matrix 1, and coats the recess portion of the substrate 4 to thereby cover the light emitting diode chip 3.

The semiconductor nanocrystal 2 may absorb the light emitting energy of the light emitting diode chip 3 and outputs the excited energy in another wavelength, which is light. The light emitting wavelength of the semiconductor nanocrystal 2 may be widely adjusted, and the semiconductor nanocrystal 2 has excellent color purity. For example, when red nanocrystal and green nanocrystal are combined with blue light emitting diode chip, a white light emitting diode may be fabricated. Also, when red, green, and blue nanocrystals are combined with an ultraviolet (UV) light emitting diode chip, a white light emitting diode may be fabricated. In addition, when a nanocrystal capable of emitting light of diverse wavelengths is combined with a light emitting diode chip, a light emitting diode emitting light of diverse wavelengths may be fabricated.

Hereafter, this disclosure will be described in detail by the following examples. The following examples are only illustrative and not restrictive.

Preparation Example 1

Preparation of Yellow Light Emitting Nanocrystal

Indium acetate (0.2 mmol) is added to a mixture of palmitic acid (0.6 mmol) and octadecene (10 mL), heated to about 120° C. under a vacuum, and maintained at that temperature for about 10 minutes. Meanwhile, about 0.075 mmol trimethylsilyl-3-phosphine and about 0.45 mmol trioctylphosphine are mixed with about 0.78 mL of octadecene to thereby prepare an injection solution. The mixture maintained in a vacuum condition is heated to about 280° C. in a nitrogen atmosphere, and the injection solution is injected into the heated mixture. Reaction proceeds for about one hour after the injection, and the mixture is then quenched to room temperature. Subsequently, acetone is injected into the quenched mixture to thereby precipitate InP nanocrystal. The precipitate is dissolved in about 1 mL of toluene to thereby prepare an InP nanocrystal solution.

Zinc acetate (0.3 mmol) is added to a mixture of oleic acid (0.6 mmol) and octadecene (10 mL), and heated to about 120° C. in a vacuum condition. Subsequently, the mixture is heated to about 220° C. in a nitrogen atmosphere, and about 1.5 mL of about 0.4 M sulfur/trioctylphosphine solution and about 1 mL of InP nanocrystal solution having an optical density of about 0.2 are injected into the mixture. Subsequently, the mixture is heated to about 300° C. and reacted for about 1 hour, and is quenched to room temperature. Acetone is injected into the quenched mixture to thereby precipitate InP/ZnS nanocrystal. The precipitate is dissolved in about 2 mL of toluene to thereby prepare an InP/ZnS nanocrystal solution.

The luminous efficiency of the InP/ZnS nanocrystal prepared according to Preparation Example 2 is about 63%, and the light emitting peak wavelength is about 573 nm, while the FWHM is about 46 nm. The light emitting peak wavelength is a wavelength illustrating a peak of the highest intensity.

Example 1-1

About 0.02 mL of water is added to about 0.3 mL of the InP/ZnS nanocrystal solution prepared according to Preparation Example 1 in a nitrogen the atmosphere at about 25° C. and maintained.

Example 1-2

About 0.02 mL of water is added to about 0.3 mL of InP/ZnS nanocrystal solution prepared according to Preparation Example 1 in a nitrogen atmosphere at about 25° C. Subsequently, light of about 450 nm is irradiated and maintained.

Comparative Example 1-1

The InP/ZnS nanocrystal solution prepared according to Preparation Example 1 is allowed to stand at about 25° C. in an air atmosphere without addition of water.

Comparative Example 1-2

The InP/ZnS nanocrystal solution prepared according to Preparation Example 1 is allowed to stand at about 25° C. in an air atmosphere without addition of water while irradiating light of about 450 nm.

After 3 hours and 6 hours, the luminous efficiency, the wavelength of the maximum peak in the light emitting spectrum, and full width at half maximum (FWHM) of the light emitting spectrum of the solutions prepared according to Examples 1-1 and 1-2 and Comparative Examples 1-1 to 1-3 are measured. The results are as described in the following Table 1. Herein, the examples, and comparative examples are measured after maintaining for 3 hours, and 6 hours respectively.

TABLE 1

|  | Luminous efficiency (%) | | | Light emitting peak wavelength (nm) | | | FWHM (nm) | | |
| --- | --- | --- | --- | --- | --- | --- | --- | --- | --- |
|  | 0 hours | 3 hours | 6 hours | 0 hours | 3 hours | 6 hours | 0 hours | 3 hours | 6 hours |
| Example 1-1 | 63 | 75 | 79 | 573 | 575 | 575 | 46 | 45 | 46 |
| Example 1-2 | 63 | 73 | 98 | 573 | 574 | 574 | 46 | 45 | 45 |
| Comparative Example 1-1 | 63 | 62 | 60 | 573 | 573 | 580 | 46 | 45 | 52 |
| Comparative Example 1-2 | 63 | 52 | 36 | 573 | 576 | 574 | 46 | 46 | 47 |

As shown in the Table 1, the semiconductor nanocrystal to which water is added in the inert gas atmosphere, may maintain the FWHM, and light emitting wavelength (e.g., light emitting peak wavelength) of the semiconductor nanocrystal, and has higher luminous efficiency as time passes. Also, the luminous efficiency of the semiconductor nanocrystal solution irradiated with light, which is the solution of Example 1-2, is highest.

Preparation Example 2

Preparation of Red Nanocrystal

Indium acetate (0.5 mmol) is added to a mixture of palmitic acid (1.5 mmol) and octadecene (10 mL), heated to about 120° C. under vacuum, and maintained at the temperature for about one hour. Meanwhile, about 0.25 mmol trimethylsilyl-3-phosphine and about 0.75 mmol trioctylphosphine are mixed with about 0.8 mL of octadecene to thereby prepare an injection solution. The mixture in a vacuum condition is quenched to about 48° C. in the atmosphere of nitrogen, and the injection solution is injected into the quenched mixture to thereby produce an InP reaction intermediate.

Indium acetate (0.2 mmol) is added to a mixture of palmitic acid (0.6 mmol) and octadecene (10 mL), heated to about 120° C. in a vacuum condition, and maintained at the temperature for about one hour. Meanwhile, about 0.1 mmol trimethylsilyl-3-phosphine and about 0.6 mmol trioctylphosphine are mixed with about 0.703 mL of octadecene to thereby prepare an injection solution. The mixture maintained in a vacuum condition is heated to about 280° C. in the atmosphere of nitrogen, and the injection solution is injected into the heated mixture. The reaction is induced for about 40 minutes after the injection. Subsequently, about 4.4 mL of the InP reaction intermediate prepared as above is added to the mixture that undergoes a reaction for 40 minutes to thereby prepare an InP/InP nanocrystal solution.

Zinc acetate (0.3 mmol) is added to a mixture of oleic acid (0.6 mmol) and octadecene (10 mL), and is heated to about 120° C. in a vacuum condition. Subsequently, the mixture is heated to about 300° C. in the atmosphere of nitrogen, and quenched to about 220° C. About 1.5 mL of about 0.4 M sulfur/trioctylphosphine solution and about 1 mL of the above-prepared InP/InP nanocrystal solution having optical density of 0.1 are injected into the mixture. Subsequently, the resultant mixture is quenched to about 300° C., reacted for about 1 hour, and quenched to room temperature. Then, acetone is added to the quenched mixture to thereby precipitate InP/InP/ZnS nanocrystal. The precipitate is dissolved in about 2 mL of toluene to thereby prepare an InP/InP/ZnS nanocrystal solution.

The luminous efficiency of the InP/ZnS nanocrystal prepared according to Preparation Example 2 is about 63%, and the light emitting peak wavelength is about 615 nm, while the FWHM is about 50 nm.

Example 2-1

About 0.02 mL of water is added to about 0.3 mL of the InP/InP/ZnS nanocrystal solution prepared in Preparation Example 2 at about 25° C. in a nitrogen atmosphere and maintained.

Example 2-2

About 0.02 mL of water and about 0.04 mL of butanol are added to about 0.3 mL of the InP/InP/ZnS nanocrystal solution prepared in Preparation Example 2 at about 25° C. in a nitrogen atmosphere and maintained.

Comparative Example 2-1

The InP/InP/ZnS nanocrystal solution prepared in Preparation Example 1 is maintained at about 25° C. in the atmosphere of air without water.

Figure 4:
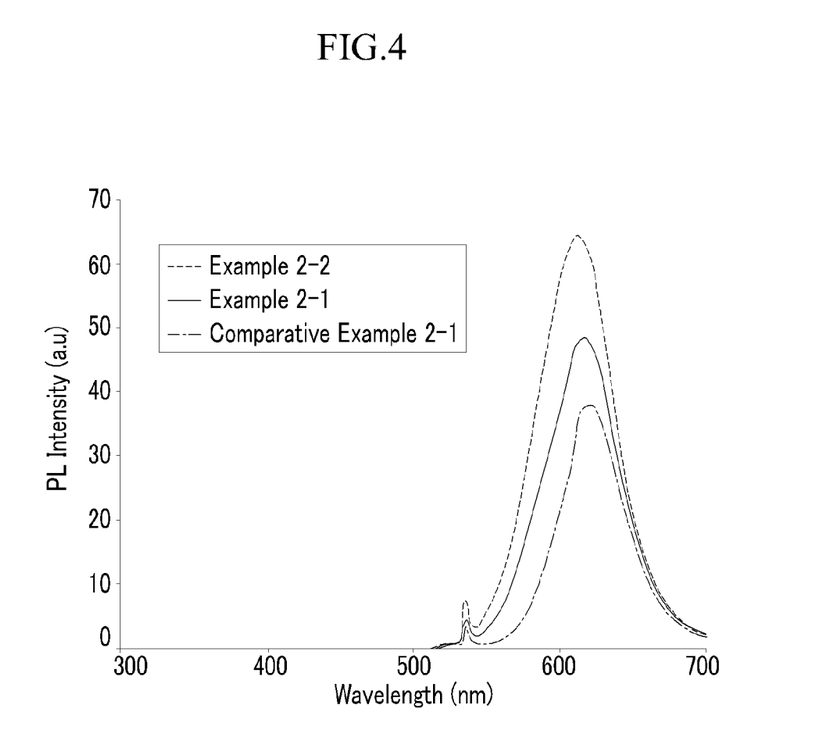
FIG. 4 is a light emitting spectrum of a semiconductor nanocrystal prepared according to an example and a comparative example of this disclosure.

After 24 hours, the luminous efficiency, wavelength of the maximum peak in the light emitting spectrum, and FWHM of the light emitting spectrum of the solutions prepared in Examples 2-1 and 2-2 and Comparative Example 2-1 are measured. The results are as shown in the following Table 2 and in FIG. 4.

TABLE 2

|  | Luminous efficiency (%) | | Light emitting peak wavelength (nm) | | FWHM (nm) | |
| --- | --- | --- | --- | --- | --- | --- |
|  | 0 hours | 24 hours | 0 hours | 24 hours | 0 hours | 24 hours |
| Example 2-1 | 63 | 72 | 615 | 614 | 50 | 51 |
| Example 2-2 | 63 | 87 | 615 | 612 | 50 | 50 |
| Comparative Example 2-1 | 63 | 63 | 615 | 615 | 50 | 50 |

As shown in Table 2, the semiconductor nanocrystal to which water is added in the inert gas atmosphere may maintain the FWHM, and light emitting wavelength (e.g., light emitting peak wavelength), and has higher luminous efficiency. The semiconductor nanocrystal of Example 2-2 to which water is added and butanol is added in the inert gas atmosphere, may maintain FWHM and light emitting wavelength (e.g., light emitting peak wavelength) of the semiconductor nanocrystal, and has higher luminous efficiency as time passes.

Preparation Example 3

Preparation of Green Nanocrystal

Indium acetate (0.2 mmol) is added to a mixture of palmitic acid (0.6 mmol) and octadecene 10 mL, heated to about 120° C. under vacuum, and quenched to room temperature. Meanwhile, about 0.2 mmol trimethylsilyl-3-phosphine and about 1.2 mmol trioctylphosphine are mixed with about 0.6 mL of octadecene to thereby prepare an injection solution. The injection solution is injected to the mixture in the atmosphere of nitrogen. After the injection, the resultant solution is heated to about 320° C. and quenched to room temperature. Subsequently, acetone is added to the quenched mixture solution to thereby precipitate InP nanocrystal. The precipitate is dissolved in about 2 mL of toluene to thereby prepare an InP nanocrystal solution.

Zinc acetate (0.3 mmol) is added to a mixture of oleic acid (0.6 mmol) and octadecene (10 mL), and is heated to about 120° C. under vacuum. The mixture is heated to about 300° C. in a nitrogen atmosphere and quenched to about 220° C. Then, about 1.5 mL of about 0.4 M sulfur/trioctylphosphine solution and about 1 mL of the above-prepared InP/InP nanocrystal solution having an optical density of about 0.1 are injected into the mixture. Subsequently, the resultant mixture solution is heated up to about 300° C., and reaction is continued for about 1 hour, and it is then quenched to room temperature. Acetone is added to the quenched mixture to thereby precipitate InP/ZnS nanocrystal. The precipitate is dissolved in about 2 mL of toluene to thereby prepare an InP/ZnS nanocrystal solution.

The luminous efficiency of the InP/ZnS nanocrystal prepared according to Preparation Example 3 is about 75%, and the light emitting peak wavelength is about 558 nm, while the FWHM is about 40 nm.

Example 3-1

About 0.02 mL of water is added to about 0.3 mL of the InP/ZnS nanocrystal solution prepared in Preparation Example 3 at about 25° C. in an atmosphere of nitrogen. Subsequently, the mixture solution is irradiated with light having a wave length of about 450 nm and is maintained.

Comparative Example 3-1

The InP/ZnS nanocrystal solution prepared in Preparation Example 3 is maintained at about 25° C. in the air atmosphere without adding water or irradiating light.

After 2 days and 5 days, the luminous efficiency, wavelength of the maximum peak in the light emitting spectrum, and FWHM of the light emitting spectrum of the solutions prepared in Examples 3-1 and Comparative Example 3-1 are measured. The results are shown in the following Table 3.

TABLE 3

| | Luminous efficiency (%) | | | Light emitting peak wavelength (nm) | | | FWHM (nm) | | |
|---|---|---|---|---|---|---|---|---|---|
| | 0 days | 2 days | 5 days | 0 days | 2 days | 5 days | 0 days | 2 days | 5 days |
| Example 3-1 | 75 | 82 | 91 | 558 | 558 | 556 | 40 | 40 | 40 |
| Comparative Example 3-1 | 75 | 69 | 64 | 558 | 558 | 556 | 40 | 40 | 40 |

As shown in the Table 3, the semiconductor nanocrystal of Example 3-1 to which water is added in the inert gas atmosphere may maintain FWHM, and light emitting wavelength (e.g., light emitting peak wavelength) of the semiconductor nanocrystal, and has increased luminous efficiency.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A semiconductor nanocrystal, comprising:
a bare semiconductor nanocrystal comprising a core-shell structure,
an organic ligand bound to the bare semiconductor nanocrystal, and
a water molecule directly bound to the bare semiconductor nanocrystal by mixing the bare semiconductor nanocrystal and water, wherein the mixing comprises:
preparing a semiconductor nanocrystal solution comprising an organic solvent and the bare semiconductor nanocrystal having the organic ligand bound thereto and adding the water to the semiconductor nanocrystal solution,
wherein the shell comprises a Group II-VI semiconductor material, a Group III-V semiconductor material, or a Group IV-VI semiconductor material,
wherein the organic ligand comprises a mercapto spacer thiol or a compound represented by the following Chemical Formula 1:

Chemical Formula 1 wherein, in Chemical Formula 1,
R is selected from a C1 to C30 alkylene group; a C6 to C30 arylene group; a C6 to C30 heteroarylene group; a C3 to C30 cycloalkylene group; a C3 to C30 heterocycloalkylene group; a C2 to C30 alkenylene group; a C2 to C30 alkynylene group; a C3 to C30 alicyclic group comprising a double bond or a triple bond in a ring; a C3 to C30 heterocycloalkylene group comprising a double bond or a triple bond in a ring; a C3 to C30 alicyclic group substituted with a C2 to C30 alkenyl group or C2 to C30 alkynyl group; or a C3 to C30 heterocycloalkylene group substituted with a C2 to C30 alkenyl group or a C2 to C30 alkynyl group,
n is an integer of 1 or more, and
X is selected from S, SH, P, P=O, $PO_3$, NH, $H_2N$, CN, NCO, O, a halogen, an acyl halide, COO, COOH, H, OH, or a combination thereof,
Y is H, and
m is an integer of 1 or more wherein the mercapto spacer thiol is selected from mercapto methyl thiol, mercapto ethyl thiol, mercapto propyl thiol, mercapto butyl thiol, and mercapto pentyl thiol,
wherein one or more functional groups of —OH, —O, or —H are further bound to the bare semiconductor nanocrystal,
the core of the bare semiconductor nanocrystal comprises the Group III-V semiconductor material, and
wherein the semiconductor nanocrystal has a luminous efficiency of about 50% or more.

2. The semiconductor nanocrystal of claim 1, wherein the water molecule is bound to the bare semiconductor nanocrystal via a coordination bond, a hydrogen bond, or via a van der Waals force.

3. The semiconductor nanocrystal of claim 1, wherein the semiconductor nanocrystal is prepared by a process comprising:
contacting a first semiconductor nanocrystal comprising a core-shell structure with an organic solvent to provide a semiconductor nanocrystal solution, and
adding water to the semiconductor nanocrystal solution.

4. A semiconductor nanocrystal of claim 1, wherein the core-shell structure has a shell defect area on a surface of the bare semiconductor nanocrystal and the water molecule is directly bound to the shell defect area on the surface of the bare semiconductor nanocrystal.

5. The semiconductor nanocrystal of claim 4, wherein the luminous efficiency is about 70% or more.

6. The semiconductor nanocrystal of claim 4, wherein the semiconductor nanocrystal has a full width at half maximum of about 60 nm or less.

7. The semiconductor nanocrystal of claim 4, wherein the semiconductor nanocrystal has a luminous efficiency of about 70% or more, an FWHM of about 45 nm or less, and a light emitting peak wavelength of about 510 to about 560 nm.

8. The semiconductor nanocrystal of claim 4, wherein the semiconductor nanocrystal has a luminous efficiency of about 70% or more, a full width at half maximum of about 50 nm or less, and a light emitting peak wavelength of about 560 to about 580 nm.

9. The semiconductor nanocrystal of claim 4, wherein the semiconductor nanocrystal has a luminous efficiency of about 70% or more, a full width at half maximum of about 60 nm or less, and a light emitting peak wavelength of about 580 to about 640 nm.

10. A method for preparing a semiconductor nanocrystal of claim 1, comprising:
mixing the bare semiconductor nanocrystal having the organic ligand bound thereto with water,
wherein the mixing of the bare semiconductor nanocrystal having the organic ligand bound thereto and the water comprises:

preparing a semiconductor nanocrystal solution comprising an organic solvent and the bare semiconductor nanocrystal having the organic ligand bound thereto, and adding the water to the semiconductor nanocrystal solution.

11. The method of claim 10, wherein a weight ratio of the water to the first semiconductor nanocrystal is about 1:1 to about 100:1.

12. The method of claim 10, wherein the water is added in an amount of about 0.01 parts by volume to about 100 parts by volume based on about 100 parts by volume of the semiconductor nanocrystal solution.

13. The method of claim 10, further comprising:
mixing the bare semiconductor nanocrystal having the organic ligand bound thereto with a polar compound.

14. The method of claim 13, wherein the polar compound is present in an amount of about 0.1 to about 10 parts by volume based on about 100 parts by volume of water.

15. The method of claim 10, wherein the mixing of the bare semiconductor nanocrystal having the organic ligand bound thereto and the water is performed under an inert gas atmosphere.

16. The method of claim 10, further comprising irradiating light to the semiconductor nanocrystal solution.

17. The method of claim 16, wherein the light has energy higher than an energy band gap of the semiconductor nanocrystal.

18. The method of claim 16, wherein the light has a shorter wavelength than a light emitting wavelength of the semiconductor nanocrystal.

19. A semiconductor nanocrystal composite comprising:
a matrix, and
the semiconductor nanocrystal of claim 1.

20. The semiconductor nanocrystal composite of claim 19, wherein the matrix comprises poly(vinyl alcohol), poly(vinyl carbazole), poly(vinyl fluoride), poly(methyl vinyl ether), poly(ethylene), poly(propylene), poly(styrene), poly(vinyl pyridine), poly(ethylene oxide), poly(alkylacrylate), poly(silane), poly(carbonate), poly(siloxane), (poly)acrylate, an epoxy resin, titania, silica, alumina, zirconia, indium tin oxide, or a mixture thereof.

21. A light emitting device, comprising:
the semiconductor nanocrystal of claim 1.

22. The light emitting device of claim 21, wherein the light emitting device comprises a first electrode and a second electrode, and the semiconductor nanocrystal or a semiconductor nanocrystal composite is disposed between the first and the second electrodes.

23. The light emitting device of claim 21, wherein the light emitting device comprises a light source, and the semiconductor nanocrystal or a semiconductor nanocrystal composite is disposed on the light source.

24. A semiconductor nanocrystal of claim 1, wherein in Chemical Formula 1,
R is selected from a C1 to C30 alkylene group; a C2 to C30 alkenylene group; or a C2 to C30 alkynylene group; and
X is selected from S, SH, CN, NCO, O, a halogen, an acyl halide, COO, COOH, H, OH, or a combination thereof.

25. A semiconductor nanocrystal solution comprising:
a semiconductor nanocrystal of claim 1, and
an organic solvent comprising an aromatic solvent, an alkane solvent, a non-polar solvent, a polar solvent, or a combination thereof.

26. The semiconductor nanocrystal solution of claim 25, wherein the organic solvent comprises chlorobenzene, toluene, hexane, octane, methyl chloride, dimethyl formaldehyde, tetrahydrofuran, or a combination thereof.

* * * * *